United States Patent
Eggers

(10) Patent No.: US 12,360,188 B2
(45) Date of Patent: Jul. 15, 2025

(54) DIXON-TYPE WATER/FAT SEPARATION MR IMAGING

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 164 days.

(21) Appl. No.: 18/275,816

(22) PCT Filed: Feb. 8, 2022

(86) PCT No.: PCT/EP2022/052981
§ 371 (c)(1),
(2) Date: Aug. 4, 2023

(87) PCT Pub. No.: WO2022/171608
PCT Pub. Date: Aug. 18, 2022

(65) Prior Publication Data
US 2024/0094320 A1    Mar. 21, 2024

(30) Foreign Application Priority Data
Feb. 11, 2021 (EP) ..................... 21156561

(51) Int. Cl.
*G01R 33/48* (2006.01)
*G01R 33/385* (2006.01)
(Continued)

(52) U.S. Cl.
CPC ....... *G01R 33/4828* (2013.01); *G01R 33/385* (2013.01); *G01R 33/50* (2013.01); *G01R 33/5608* (2013.01); *G01R 33/56518* (2013.01)

(58) Field of Classification Search
CPC .. G01R 33/385; G01R 33/4828; G01R 33/50; G01R 33/5608; G01R 33/56518
See application file for complete search history.

(56) References Cited

U.S. PATENT DOCUMENTS 7,112,965 B2 * 9/2006 Scheffler ............ G01R 33/5615
324/309
10,429,463 B2 * 10/2019 Wheaton ............ G01R 33/3854
(Continued)

FOREIGN PATENT DOCUMENTS

EP    3511725 A1    7/2019
WO    2017207700 A1    12/2017

OTHER PUBLICATIONS

Eggers et al "Chemical Shift Encoding Based Water Fat Separation Methods" Journal of Magnetic Resonance Imaging, vol. 40, p. 251-268 (2014).

(Continued)

*Primary Examiner* — Gregory H Curran

(57) ABSTRACT

The invention relates to a method of Dixon-type MR imaging. The object (10) is subjected to a dual- or multi-acquisition imaging sequence comprising a series of temporally equidistant RF pulses. An echo signal is generated in the presence of a readout magnetic field gradient in each time interval (TR) between successive RF pulses, with the echo time varying between at least a first value (TE1) associated with a first acquisition (ACQ1) and a second value (TE2) associated with a second acquisition (ACQ2). The invention proposes that at least one of the magnetic field gradients preceding and/or succeeding the readout magnetic field gradient in each time interval (TR) is temporally shifted, varied in duration and/or varied in amplitude between time intervals (TR). In this way, a reduction of the acoustic noise generated by the multi-acquisition Dixon sequence and, thus, of the discomfort for patients undergoing a corresponding examination is achieved. The echo signals are recorded and an MR image is reconstructed with separating signal contributions from water and fat based on the recorded echo signals of the at least two acquisitions (Continued)

(ACQ1, ACQ2). Moreover the invention relates to an MR device (1) and to a computer program to be run on an MR device (1).

8 Claims, 3 Drawing Sheets

(51) Int. Cl.
  *G01R 33/50* (2006.01)
  *G01R 33/56* (2006.01)
  *G01R 33/565* (2006.01)

(56) References Cited

U.S. PATENT DOCUMENTS

| 11,460,523 B2* | 10/2022 | Mohseni .................. G01R 33/26 |
| 2012/0112743 A1 | 5/2012 | Granlund et al. |
| 2014/0232396 A1 | 8/2014 | Grodzki et al. |
| 2014/0347050 A1 | 11/2014 | Gui et al. |
| 2015/0077109 A1 | 3/2015 | Grodzki |
| 2015/0241535 A1 | 8/2015 | Grodzki |
| 2016/0103195 A1 | 4/2016 | Zuehldorff et al. |
| 2020/0363486 A1 | 11/2020 | Eggers |

OTHER PUBLICATIONS

Hernando et al "Addressing Phase Errors in Fat-Water Imaging Using a Mixed Magnitude Complex Fitting Method" Magnetic Resonance in Med. vol. 67, No. 3 p. 638-644 (2012).

International Search Report and Written Opinion from PCT/EP2022/052981 mailed May 20, 2022.

Hamaguchi T et al: "Acoustic Noise Transfer Function in Clinical MRI", Academic Radiology, Elsevier, Amsterdam, NL, vol. 18, No. 1, Jan. 1, 2011 (Jan. 1, 2011), pp. 101-106.

Heismann Bet Al: "Sequence-based acoustic noise reduction of clinical MRI scans", Magnetic Resonance in Medicine, John Wiley & Sons, Inc, United States, vol. 73, No. 3, Mar. 1, 2015 (Mar. 1, 2015), pp. 1104-1109.

* cited by examiner

PRIOR ART

DIXON-TYPE WATER/FAT SEPARATION MR IMAGING

CROSS REFERENCE TO RELATED APPLICATIONS

This application is a U.S. national phase application of International Application No. PCT/EP2022/052981 filed on Feb. 8, 2022, which claims the benefit of EP application Ser. No. 21/156,561.9 filed Feb. 11, 2021 and is incorporated herein by reference.

FIELD OF THE INVENTION

The invention relates to the field of magnetic resonance (MR) imaging. It concerns a method of MR imaging of an object placed in the examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic field (RF field) of defined frequency (Larmor frequency) in the radiofrequency range. From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (90° flip angle).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which the phase is uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the Larmor frequency. The signal picked up in the receiving coils then contains components of different frequencies which can be associated with different locations in the body. The signal data obtained via the receiving coils correspond to the spatial frequency domain and are called k-space data. The k-space data usually include data from multiple lines in k-space, acquired with different phase encoding. Each k-space line is digitized by collecting a number of samples. A set of samples from multiple lines in k-space is converted to an MR image, e.g., by means of Fourier transformation.

In MR imaging, it is often desired to obtain information about the relative contribution of water and fat to the overall signal, either to suppress the contribution of one of them or to separately or jointly analyse the contribution of both of them. These contributions can be calculated if information from two or more corresponding echoes, acquired at different echo times (with respect to excitation or spin echo refocussing), is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type measurements. By means of Dixon MR imaging or Dixon water/fat MR imaging, a water/fat separation is achieved by calculating contributions of water and fat from two or more corresponding echoes, acquired at different echo times. In general such a separation is possible because there is a known precessional frequency difference of hydrogen in water and fat. In its simplest form, water and fat images are generated by either addition or subtraction of the in-phase and out-of-phase datasets.

Several Dixon-type MR imaging methods have been proposed in recent years. Apart from different strategies for the water/fat separation, the known techniques are mainly characterized by the specific number of echoes (points) they acquire and by the constraints that they impose on the used echo times. Conventional so-called two- and three-point methods require in-phase and opposed-phase echo times at which the water and fat signals are parallel and anti-parallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a flexible dual-echo Dixon-type MR imaging method which enables the elimination of such constraints. Using such Dixon-type MR imaging methods with more flexible echo times, in-phase and opposed-phase images are no longer necessarily acquired, but optionally synthesized from water and fat images.

Dixon-type MR imaging methods are often applied in combination with gradient-echo imaging. While they are commonly implemented with a dual-echo sequence, a dual-acquisition sequence is favored especially in high-resolution imaging (see Eggers et al., Journal of Magnetic Resonance Imaging, 40, 251-268, 2014).

In FIG. 2, a schematic pulse sequence diagram of conventional dual-acquisition gradient-echo imaging is depicted. The diagram shows switched magnetic field gradients in the frequency-encoding (readout) direction M, the phase-encoding direction P, and the slice-selection direction S. Moreover, the diagram shows RF pulses, applied in fixed time intervals of duration TR, and acquisition windows, designated by ACQ1 and ACQ2, during which gradient-echo signals are collected. The diagram covers the acquisition of the first two echo signals. In subsequent repetitions, the phase-encoding magnetic field gradients in the directions P and S are scaled to sample a pre-defined region of k-space. As illustrated in FIG. 2, a dual-acquisition Dixon gradient-echo imaging sequence generates two echoes at two different echo times TE1 and TE2 after two RF pulses by shifting the readout magnetic field gradient within the fixed TR while keeping the phase-encoding magnetic field gradients unchanged. Due to the shifting of the readout magnetic field gradient, different phase offsets of the contributions from water and fat to the overall signal are obtained, on the basis of which the Dixon-type water/fat separation is performed. As can further be seen in FIG. 2, the dephasing lobes of the readout magnetic field gradient in direction M and of the phase-encoding magnetic field gradients in directions P and S are shifted with the re-phasing lobe of the readout magnetic field gradient in the second depicted time interval (second acquisition). However, this conventional approach, which is chosen to keep adverse effects of eddy currents in the two acquisitions as similar as possible, restricts the degrees of freedom remaining in the design of the imaging sequence to achieve a reduction of acoustic noise caused by the switching of the magnetic field gradients.

SUMMARY OF THE INVENTION

It is an object of the invention to provide a method that enables a further improved Dixon water/fat separation in combination with a dual- or multi-acquisition imaging technique.

In accordance with the invention, a method of MR imaging of an object placed in an examination volume of an MR device is disclosed. The method comprises the steps of:
subjecting the object to a dual- or multi-acquisition imaging sequence comprising a series of temporally equidistant RF pulses, wherein an echo signal is generated in the presence of a readout magnetic field gradient in each time interval between successive RF pulses, with the echo time varying between at least a first value associated with a first acquisition and a second value associated with a second acquisition, wherein on the basis of an established relationship between (i) the arrangement of the magnetic field gradients preceding and/or succeeding the readout magnetic field gradient in each time interval (TR) and (ii) the acoustic noise level caused by the switching of the magnetic field gradients at least one of the magnetic field gradients preceding and/or succeeding the readout magnetic field gradient in each time interval (TR) is temporally shifted, varied in duration and/or varied in amplitude between time intervals (TR), so as to reduce the acoustic noise level
recording the echo signals, and
arrange for reconstructing an MR image with separating signal contributions from water and fat based on the recorded echo signals of the at least two acquisitions.

According to the invention, a dual- or multi-acquisition imaging sequence is used to acquire two or more sets of echo signals in separate acquisitions. Typically, the two or more acquisitions use separate RF excitations. However, it is also feasible to acquire the echo signals of the two or more acquisitions after a single RF excitation pulse, e.g. in an alternating fashion after successive RF refocusing pulses. In the latter case the time interval within the meaning of the invention is the interval between successive RF refocusing pulses.

The timing and strength of the readout magnetic field gradient are chosen to shift the acquisition windows of the two echo signals such that appropriate phase offsets of the contributions from water and fat to the overall signal are obtained, on the basis of which the Dixon-type separation of these contributions is performed in the reconstruction step.

The essential feature of the invention is exploiting the effect that shifting and/or stretching of particular magnetic field gradient lobes in the Dixon multi-acquisition sequence has on the acoustic noise. On this basis, the acoustic noise generated by multi-acquisition Dixon sequences and, thus, the discomfort for patients undergoing corresponding examinations can be minimized. To this end, the invention proposes that some of the magnetic field gradients preceding and/or succeeding the readout magnetic field gradient in each time interval are temporally shifted, varied in duration and/or varied in amplitude between time intervals (e.g. from one time interval to the next) in a targeted fashion so that acoustic noise caused by the switching of the magnetic field gradients is reduced vis-à-vis the conventional approach. An insight of the invention is that there is a well-defined relationship between the way the magnetic field gradients preceding and/or succeeding the readout magnetic field gradient are arranged and the acoustic noise level caused by the switching of the magnetic field gradients. This relationship may be established by calibration on the basis of measurements or computations and of an acoustic model representing the acoustic behaviour of the gradient switching. Accordingly, this established relationship is the basis for controlling the acoustic noise level by (re)-arrangement of the magnetic field gradients preceding and/or succeeding the readout magnetic field gradient. In particular, the (re)-arrangement can be carried-out by reducing or even minimizing the acoustic noise level as a function of the arrangement of the magnetic field gradients per repetition time interval (TR). Alternatively, the arrangement of the magnetic field gradients preceding and/or succeeding the readout magnetic field gradient corresponding to a pre-set (minimum) acoustic noise level may be returned by a trained neural network provided with a limited set of imaging parameters such as the repetition time and the echo times for a multi-acquisition imaging sequence as input. The neural network may be trained on a multitude of arrangements of the magnetic field gradients and corresponding acoustic noise levels, determined on the basis of acoustic noise measurements or model-based simulations of the acoustic behaviour.

The magnetic resonance imaging system is configured to arrange for reconstruction of the set of magnetic resonance images from the echo signals in that reconstruction software is installed in the magnetic resonance examination system's computational system or in that the computational system has access to a remote reconstruction facility. The reconstruction software may be installed on a remote server, e.g.

in the healthcare institution of even accessible to a data-network in that the reconstruction software may be available in 'the cloud', In these remote configurations the computational system is equipped with functionality to arrange for reconstruction of the set of magnetic resonance images at the remotely located reconstruction function. Moreover, reconstruction of the magnetic resonance image may be done by way of machine learning, for example by a trained neural network that may be incorporated ion the computational system or may be accessible from a remote location.

In a preferred embodiment, a systematic approach is taken to reduce the acoustic noise on the basis of the modelling of an acoustic spectrum, involving an MR device-specific acoustic transfer function relating the frequency components of the temporal course of the switched magnetic field gradients to acoustic frequency components. In this way, e.g., the acoustic resonances of the specific MR device used for imaging can be avoided and, thus, the noise level can be reduced to a significant extent.

In another preferred embodiment, the sequence of echo signals associated with the first and second acquisition is chosen in such a fashion that acoustic noise caused by the switching of the magnetic field gradients is minimized. This means that, in addition to the shifting and stretching of the particular magnetic field gradient lobes described above, the order in which the echo signals associated with the two or more acquisitions are collected is optimized to reduce the noise level for the patient. Options include an alternation between the two acquisitions after each time interval or transitions between the two acquisitions after several time intervals, as well as a single switchover from one acquisition to the other after the completion of one of the acquisitions.

The shifting and stretching of the magnetic field gradient lobes according to the invention modifies the effects of eddy currents in the two or more acquisitions. However, it is an insight of the invention that the corresponding modified phase errors can be corrected for and do not need to be pre-emptively avoided, e.g., by always arranging the respective dephasing lobes immediately before the re-phasing lobe of the readout magnetic field gradient. Techniques for determining and compensating for phase errors caused by magnetic field gradient switching-induced eddy currents in Dixon imaging are known as such in the art. For example, such phase errors can be estimated in a separate calibration measurement and can be compensated either in the acquisition or the reconstruction.

In yet another preferred embodiment, the imaging sequence applied according to the invention is a turbo spin echo (TSE) sequence comprising an RF excitation pulse succeeded by a number of RF refocusing pulses, with each of the echo signals being generated in the time interval between successive RF refocusing pulses. This means that the approach of the invention is combined with a dual- or multi-acquisition TSE sequence as it is often applied in combination with Dixon-type MR imaging. Typically, two or three interleaved acquisitions with shifted readout magnetic field gradients and acquisition windows are employed.

The method of the invention described thus far can be carried out by means of an MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
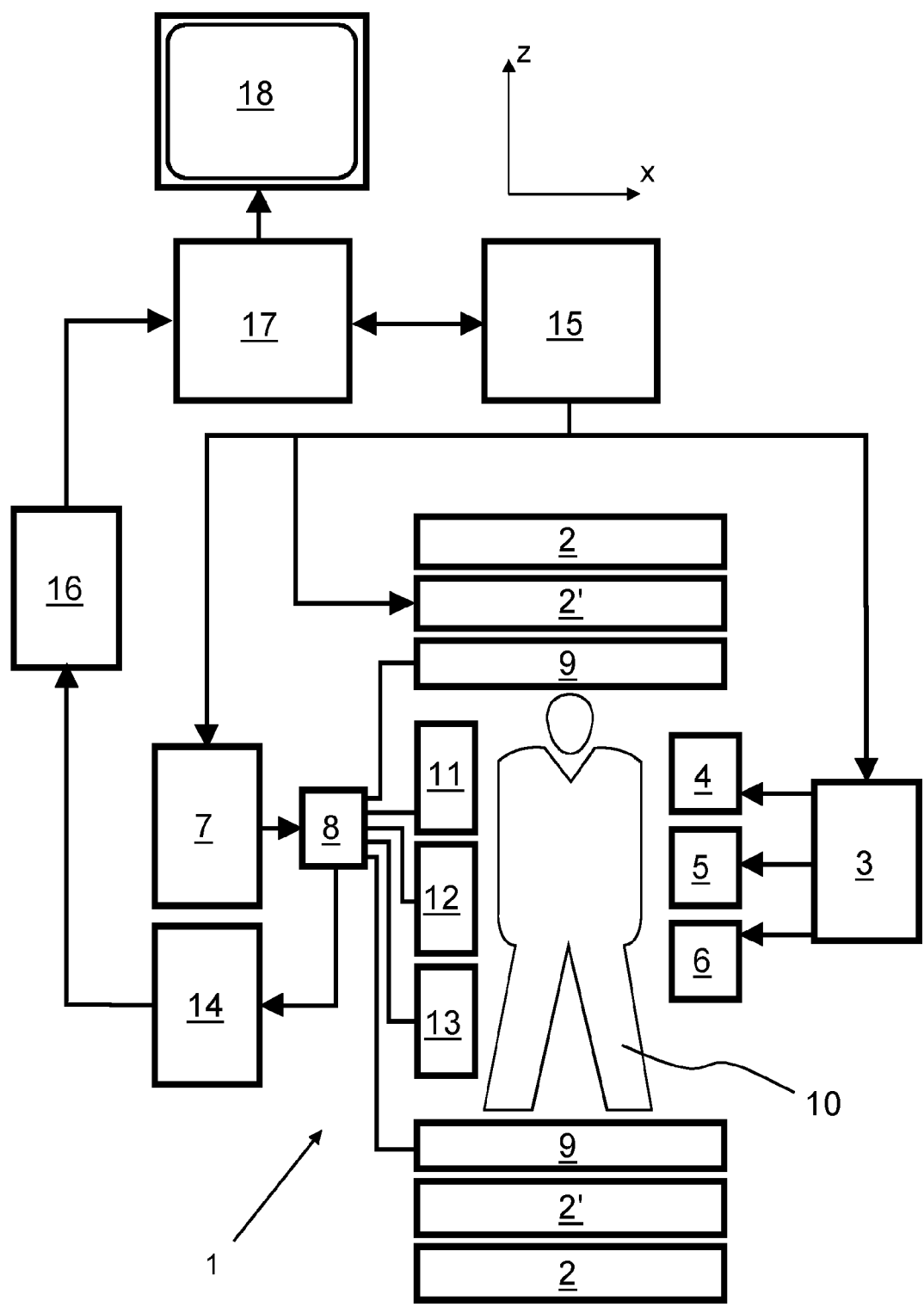
FIG. 1 shows an MR device for carrying out the method of the invention.

With reference to FIG. 1, an MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert, excite, saturate, refocus, and spatially and otherwise encode the magnetic resonance to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. In particular, the RF pulses select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by transmissions of the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequence of the invention. For the selected sequence, the receiver 14 receives signal data from a single or a plurality of k-space lines in rapid succession following each RF excitation pulse. A data acquisition system 16 performs analog-to-digital conversion of the received signals and converts each k-space line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are arranged, by corresponding programming, to perform the method of the invention described herein above and in the following.

Figure 2:
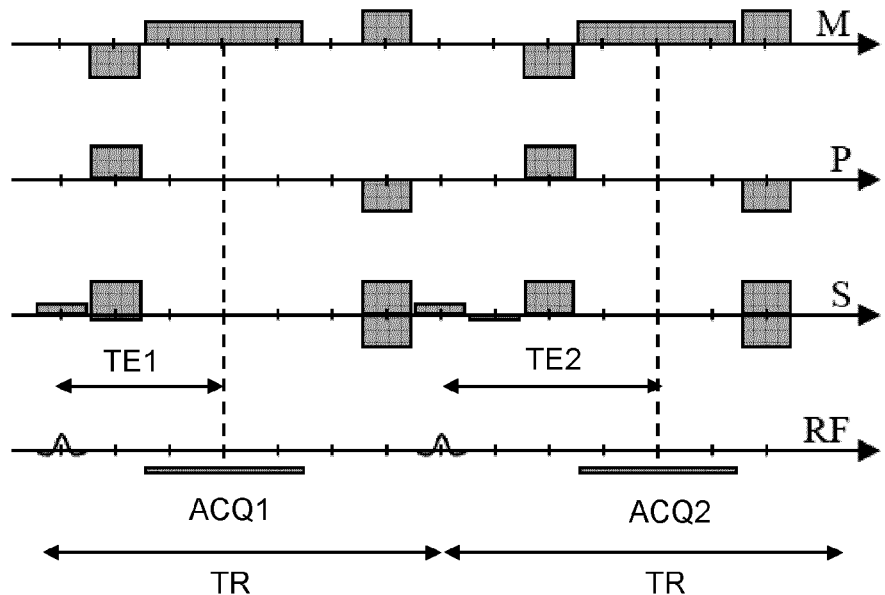
FIG. 2 shows a schematic (simplified) pulse sequence diagram of a conventional multi-acquisition Dixon imaging sequence.
Figure 3:
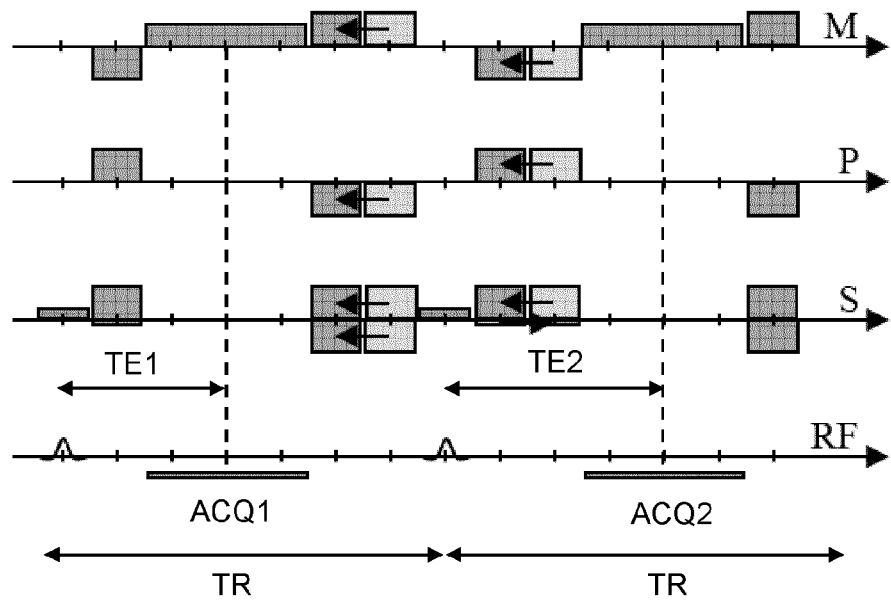
FIG. 3 shows a schematic (simplified) pulse sequence diagram according to a first embodiment of the invention.

FIG. 3 shows a pulse sequence diagram of a dual-acquisition gradient-echo sequence constituting an imaging sequence according to the invention. The diagram shows switched magnetic field gradients in the frequency-encoding (readout) direction M, the phase-encoding direction P, and the slice-selection direction S. Moreover, the diagram shows the RF pulses, applied in fixed time intervals of duration TR, and acquisition windows, designated by ACQ1 and ACQ2, during which gradient-echo signals are collected in the presence of a readout magnetic field gradient in direction M. One gradient echo is generated in each time interval between successive RF excitations. The diagram covers the acquisition of the first two echo signals. In subsequent time intervals, the phase-encoding magnetic field gradients in the directions P and S are scaled to sample a pre-defined region of k-space. The two echoes are generated at two different echo times TE1 and TE2 after two RF pulses by shifting the readout magnetic field gradient within the fixed TR while keeping the phase-encoding magnetic field gradients unchanged. Due to the shifting of the readout magnetic field gradient and the resulting different echo times TE1 and TE2, different phase offsets of the contributions from water and fat to the overall signal are obtained, on the basis of which the Dixon-type water/fat separation is performed. According to the invention, some of the magnetic field gradients (dephasing and re-phasing lobes of phase-encoding magnetic field gradients, as well as spoiling lobes of magnetic field gradients in the example) preceding and/or succeeding the rephasing lobe of the readout magnetic field gradient are temporally shifted in relation to the pulse sequence diagram of FIG. 2, as indicated by the arrows in FIG. 3. The re-phasing lobes of the phase-encoding magnetic field gradients and the spoiling lobes of magnetic field gradients after the first acquisition are moved closer to the rephasing lobe of the readout magnetic field gradient of the first acquisition, and the dephasing lobes of the readout and phase-encoding magnetic field gradients of the second acquisition are moved farther away from the rephasing lobe of the readout magnetic field gradient of the second acquisition. The light grey rectangles in FIG. 3 illustrate the respective original temporal positions of the respective magnetic field gradients (corresponding to the situation shown FIG. 2).

Figure 4:
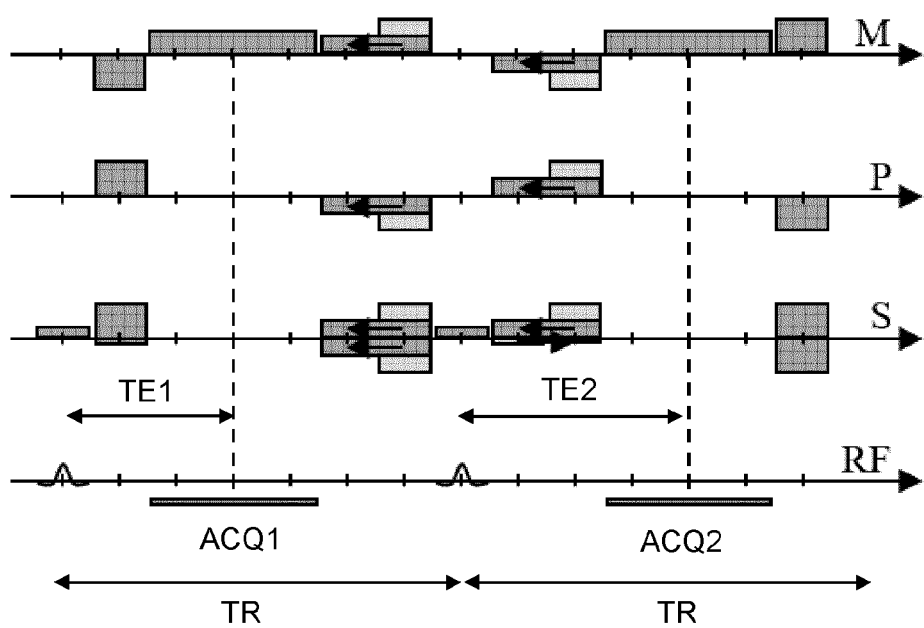
FIG. 4 shows a schematic (simplified) pulse sequence diagram according to a second embodiment of the invention.

In the pulse sequence diagram of FIG. 4 also illustrating an embodiment of the invention, the corresponding magnetic field gradients preceding and/or succeeding the rephasing lobe of the readout magnetic field gradient are temporally stretched and, simultaneously, reduced in amplitude in relation to the pulse sequence diagram of FIG. 2, as indicated by the arrows in FIG. 4. The light grey rectangles in FIG. 4 again illustrate the respective original temporal shapes and positions of the respective magnetic field gradients.

The invention applies the depicted shifting and/or stretching of particular lobes of the magnetic field gradients in a targeted fashion to reduce the acoustic noise generated by the multi-acquisition Dixon sequence. To estimate the acoustic noise produced by the imaging sequence within a time interval TR, the frequency spectrum $\underline{s}_n$ of a trapezoidal gradient lobe m can be modelled by $$\underline{S}_{m,n} = \begin{cases} \frac{e^{-i2\pi f_n t_r}}{i2\pi f_n} \left( e^{i\pi f_n (t_p + t_{sl})} \mathrm{sinc}(\pi f_n t_{sl}) - e^{i\pi f_n (t_p + t_{st})} \mathrm{sinc}(\pi f_n t_{st}) \right) \underline{G}, & n \neq 0 \\ \left( t_p + \frac{t_{sl}}{2} + \frac{t_{st}}{2} \right) \underline{G}, & n = 0 \end{cases}$$

with the harmonics $f_n = \frac{n}{TR}$.

$\underline{G}$ describes the strength (amplitude) and direction of the gradient lobe, $t_r$ denotes the relative position of the center of the plateau of the trapezoid within the time interval TR, $t_p$ is the relative length of the plateau, and $t_{sl}$ and $t_{st}$ are the relative lengths of the leading and trailing slopes.

The acoustic noise is then calculated, e.g., according to $$10 \log(\Sigma_n |\underline{A}_n{}^H \Sigma_m \underline{S}_{m,n}|^2 / a_0),$$

where $\underline{A}$ denotes an MR device-specific acoustic transfer function, which relates the frequency components of the temporal course of the magnetic field gradients to the corresponding frequency components of the acoustic noise, and $a_0$ is a suitable reference value. The parameters $\underline{G}$, $t_r$, $t_p$, $t_{sl}$ and $t_{st}$ of each gradient lobe of the imaging sequence are adapted according to the invention in such a fashion that the acoustic noise calculated on this basis is reduced vis-à-vis the acoustic noise generated by the conventional sequence design FIG. 2.

The invention claimed is:
1. A method of magnetic resonance (MR) imaging of an object placed in an examination volume of an MR device, the method comprising:
subjecting the object to a dual-or multi-acquisition imaging sequence comprising a series of temporally equidistant RF pulses, wherein an echo signal is generated in the presence of a readout magnetic field gradient in each time interval (TR) between successive RF pulses, with the echo time varying between at least a first value

(TE1) associated with a first acquisition (ACQ1) and a second value (TE2) associated with a second acquisition (ACQ2), and wherein on a basis of a relationship between (i) arrangement of the magnetic field gradients preceding and/or succeeding the readout gradient in each time interval (TR) and (ii) an acoustic noise level caused by the switching of the magnetic field gradients at least one of the magnetic field gradients preceding and/or succeeding the readout magnetic field gradient in each time interval (TR) is temporally shifted, varied in at least one of duration or varied in amplitude between time intervals (TR), so as to reduce the acoustic noise level recording the echo signals, and arranging for reconstructing an MR image with separating signal contributions from water and fat based on the recorded echo signals of the at least two acquisitions (ACQ1, ACQ2).

2. The method of claim 1, wherein the magnetic field gradients at least one of preceding or succeeding the readout magnetic field gradient in each time interval (TR) are temporally shifted, varied in at least one of duration or varied in amplitude between time intervals (TR) in such a fashion that acoustic noise caused by the switching of the magnetic field gradients is minimized.

3. The method of claim 2, wherein the minimization is based on the modelling of an acoustic spectrum, involving an MR device-specific acoustic transfer function relating the frequency components of the temporal course of the switched magnetic field gradients of the imaging sequence to acoustic frequency components, wherein the frequency components could be frequency of the magnetic field gradients that generate acoustic noise.

4. The method of claim 1, wherein the sequence of echo signals associated with the first respectively with the second acquisition (ACQ1, ACQ2) is chosen in such a fashion that acoustic noise caused by the switching of the magnetic field gradients is minimized.

5. The method of claim 1, wherein the reconstruction of the MR image involves estimating and correcting for eddy current-induced phase errors in the recorded echo signals.

6. The method of claim 1 wherein the imaging sequence is a turbo spin echo sequence comprising an RF excitation pulse succeeded by a number of RF refocusing pulses, with each of the echo signals being generated in the time interval between successive RF refocusing pulses.

7. A magnetic resonance (MR) device comprising at least one main magnet coil for generating a uniform, static magnetic field Bo within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and access to a reconstruction unit for reconstructing MR images from the received MR signals, wherein the MR device is configured to perform the method of claim 1.

8. A computer program comprising executable instructions stored on a non-transitory computer readable medium, which when executed by a processor causes a magnetic resonance (MR) device, to perform the method of claim 1.

* * * * *